(12) United States Patent
Liu

(10) Patent No.: US 12,089,356 B2
(45) Date of Patent: Sep. 10, 2024

(54) TERMINAL DEVICE

(71) Applicant: Beijing Xiaomi Mobile Software Co., Ltd., Beijing (CN)

(72) Inventor: Bing Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 396 days.

(21) Appl. No.: 17/455,841

(22) Filed: Nov. 19, 2021

(65) Prior Publication Data

US 2022/0369488 A1   Nov. 17, 2022

(30) Foreign Application Priority Data

May 14, 2021   (CN) .......................... 202110529093.7

(51) Int. Cl.
| | | |
|---|---|---|
| H05K 5/04 | (2006.01) | |
| C23C 28/00 | (2006.01) | |
| G04B 37/00 | (2006.01) | |
| G06F 1/16 | (2006.01) | |
| H04M 1/02 | (2006.01) | |

(52) U.S. Cl.
CPC ............. *H05K 5/04* (2013.01); *C23C 28/32* (2013.01); *C23C 28/34* (2013.01); *G04B 37/0008* (2013.01); *G06F 1/163* (2013.01); *H04M 1/0202* (2013.01)

(58) Field of Classification Search
None
See application file for complete search history.

(56) References Cited

U.S. PATENT DOCUMENTS

| | | | |
|---|---|---|---|
| 8,920,332 B2 * | 12/2014 | Hong | ................ A61B 5/02438 |
| | | | 600/483 |
| 2018/0275609 A1 * | 9/2018 | Sogo | ...................... C23C 28/36 |

FOREIGN PATENT DOCUMENTS

| | | |
|---|---|---|
| CN | 103805996 A | 5/2014 |
| CN | 106572211 A | 4/2017 |
| CN | 107302608 A | 10/2017 |
| CN | 108893739 A | 11/2018 |
| EP | 0368470 A1 | 5/1990 |
| EP | 3305258 A1 | 4/2018 |

OTHER PUBLICATIONS

State Intellectual Property Office of the People's Republic of China, Office Action and Search Report Issued in Application No. 202110529093.7, Mar. 13, 2024, 15 pages.

* cited by examiner

*Primary Examiner* — Daniel J. Schleis
(74) *Attorney, Agent, or Firm* — McCoy Russell LLP

(57) ABSTRACT

A terminal device can include a metal contact component. The metal contact component can include a metal substrate and a non-allergenic contact layer which is on the metal substrate and the non-allergenic contact layer forms a part of outer surface of the terminal device.

19 Claims, 2 Drawing Sheets

TERMINAL DEVICE

CROSS-REFERENCE TO RELATED APPLICATION

The present application claims priority to Chinese Patent Application No. 202110529093.7, filed on May 14, 2021. The entire content of the above-listed application is hereby incorporated by reference for all purposes.

BACKGROUND

With continuous development of electronic science and technology, various terminal devices for realizing different functions emerge. For example, a user can hold a mobile phone terminal with a hand for communication. For another example, the user can put on a wearable device to detect body parameters or motion conditions. It can be understood that the user needs to make direct contact with the appearance surface of a terminal device whether it is a hand-held terminal device or a wearable terminal device, so that whether the material of the appearance surface of the terminal device is allergenic will directly affect usage experience of the user.

SUMMARY

The disclosure relates to the technical field of terminals, and relates to a terminal device.

An embodiment of the disclosure provides a terminal device, including a metal contact component, the metal contact component at least includes:

a metal substrate; and a non-allergenic contact layer, on the metal substrate and the non-allergenic contact layer forms a part of outer surface of the terminal device.

It should be understood that both the above general descriptions and the following detailed descriptions are explanatory only, and cannot limit the disclosure.

BRIEF DESCRIPTION OF THE DRAWINGS

The accompanying drawings, which are incorporated in the specification and constitute a part of this specification, illustrate embodiments conforming to the disclosure and together with the specification serve to explain the principles of the disclosure.

DETAILED DESCRIPTION

Some embodiments will be described in detail herein, and examples of which are illustrated in the accompanying drawings. When the following description refers to the accompanying drawings, same reference numbers in different drawings represent same or similar elements unless otherwise stated. The implementations described in the following embodiments do not represent all implementations consistent with the disclosure. On the contrary, they are only examples of an apparatus and a method consistent with some aspects of the disclosure.

Terms used in the disclosure only intend to describe specific embodiment rather than limit the disclosure. A singular form 'a', 'an' and 'the' used in the disclosure is also intended to include a plural form unless other meanings are set forth clearly in context. It should also be understood that term 'and/or' used herein refers to and includes any or all possible combinations of one or more related listed items.

It should be appreciated that terms like first, second, third and the like may be used in the disclosure for describing various information, but these information is not supposed to be limited by these terms. These terms are only used for distinguishing information of the same type. For example, without departing from the scope of the disclosure, first information may be also called second information, and likewise, the second information may be also called first information. Depending on the context, the word 'if' used herein may be constructed as 'when' or 'in response to determining'.

In order to improve the usage experience of a user, the technical solution of the disclosure is described in detail by taking a terminal device including a wristband 100 shown in FIG. 1 for example as follows.

Figure 1:
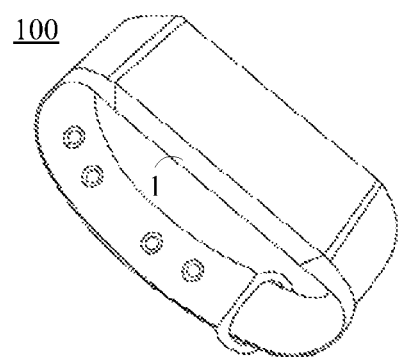
FIG. 1 is a schematic structural diagram of a terminal device shown according to an embodiment.
Figure 2:
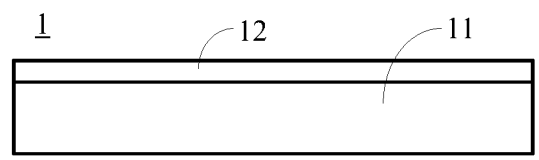
FIG. 2 is a schematic sectional view of a metal contact component shown according to an embodiment.

As shown in FIG. 1 and FIG. 2, the wristband 100 may include a metal contact component 1. The metal contact component 1 may form a whole shell of the wristband 100, so that the metal contact component 1 will make direct contact with skin of the user when the user wears the wristband 100. Thus, in order to improve user's experience, the metal contact component 1 may include a metal substrate 11 and a non-allergenic contact layer 12, and the non-allergenic contact layer 12 may be arranged on the side of the metal substrate 11 facing the exterior of the wristband 100 and may form part of outer surface of the terminal device. Based on this, when the user wears the wristband 100, the non-allergenic contact layer 12 of the metal contact component 1 may make direct contact with the skin of the user to prevent the user from allergies, which is advantageous to widen a range of a target object group of the wristband 100, improve user's experience, and improve the market share of the terminal device. The metal substrate may include an aluminum substrate or an aluminum alloy substrate, which is advantageous to realize lightweight of the metal shell, and reduce the weight for configuring the terminal device.

A technical solution provided by the embodiment of the disclosure can include the following beneficial effects: it can be known from the above embodiment that the non-allergenic contact layer in the disclosure forms the outer surface of the metal contact component, so that the non-allergenic contact layer makes direct contact with the skin of a user when the user holds or wears the terminal device, which can prevent the user from allergies, widen the range of a target object group of the terminal device advantageously, improve user's experience and the market share of the terminal device.

Description is made by taking the metal contact component 1 as the whole shell for example herein. In some embodiments, the shell of the wristband 100 may include a body and the metal contact component 1, the metal contact component 1 is connected with the body, so that the metal contact component 1 serves as only a part of the shell of the terminal device. For example, the metal contact component 1 may be embedded into the body by welding or the metal contact component 1 is connected with the edge of the body, and there is no limit herein. In the above embodiment, only the relation between the metal contact component 1 and the shell of the wristband is described. In some embodiments, the wristband 100 may further include a watchband, a frame, a buckle, a magnetic interface, and a metal sheet arranged on the side facing away from a watch plate and assembled on the watch plate. One or more members among the shell, the watchband, the frame, the buckle, the magnetic interface and the metal sheet may include the metal contact component 1, the metal contact component 1 may be the whole member or a part of any member, for example, the metal contact component 1 may be connected with the member by welding, which is not limited herein.

The metal contact component 1 may form a plurality of members of the wristband 100, each of the members may be of the metal contact component 1 as a whole or partially, which is not limited herein. For example, if a watch or a wristband is charged in a wireless manner, the watch or the wristband may further include a magnetic interface for being connected with an external charging device, and the magnetic interface faces the side facing away from the watch plate of the watch or the wristband. When the user wears the watch, the magnetic interface makes contact with the skin of the user, and in order to solve the problem of the magnetic interface being allergenic, the magnetic interface of the watch may include the metal contact component 1. The magnetic interface may be arranged in any region of the metal sheet of the wristband or the watch or any region of the shell, or another position, which is not limited herein.

Figure 3:
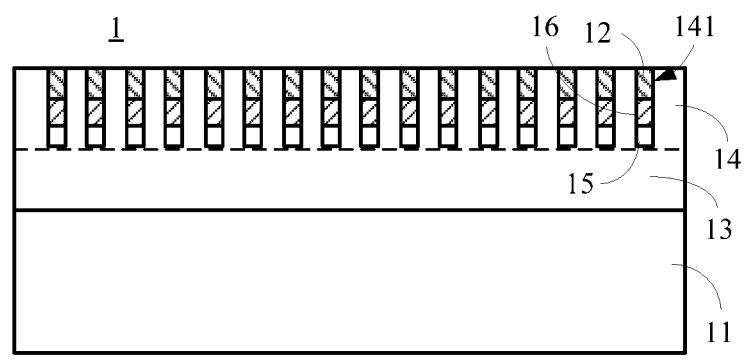
FIG. 3 is a schematic sectional view of another metal contact component shown according to an embodiment.

In some embodiments, as the metal contact component 1 may form the outer surface of the terminal device, in order to improve the appearance attractiveness of the metal contact component 1, the disclosure provides a metal contact component 1 shown in FIG. 3, a schematic sectional view of the metal contact component 1. As shown in FIG. 3, the metal contact component 1 may include a metal substrate 11, a blocking layer 13, a porous layer 14, a coloring layer 15, a pore sealing layer 16 and a non-allergenic contact layer 12. The blocking layer 13 is formed on the surface of the metal substrate 11, the porous layer 14 is formed on the surface of the blocking layer 13, the porous layer 14 includes a plurality of micropores 141, the opening direction of the micropores 141 is toward the side facing away from the metal substrate 11. The coloring layer 15 is formed on the surface of the porous layer 14 and is filled in the micropores 141 included in the porous layer 14, so that the metal contact component 1 is decorated through the coloring layer 15, and the appearance attractiveness of the metal contact component 1 is improved.

As the coloring layer 15 is arranged in the micropores 141 of the porous layer 14, in order to avoid color fading, a pore sealing process may be performed on the metal substrate 11 with the coloring layer 15 formed thereon. Specifically, the metal substrate 11 may be put in a first closed tank containing a first bath solution for a first-stage pore sealing treatment, so that a pore sealing layer 16 covering the coloring layer 15 is deposited in the micropores 141. And then the metal substrate 11 is put in a second closed tank containing a second bath solution for a second-stage pore sealing treatment, so that the non-allergenic contact layer 12 covering the pore sealing layer 16 is deposited in the micropores 141. Based on this, the pore sealing layer 16 covering the coloring layer 15 may be formed in the micropores 141, the coloring layer 15 is protected by bonding the pore sealing layer 16 and the inner wall of the micropores 141, and color fading or color escaping in the pore sealing process is avoided. The non-allergenic contact layer 12 covering the pore sealing layer 16 is formed in the micropores 141, on one hand, a pore sealing material of the pore sealing layer 16 can be prevented from being separated out, and on the other hand, the user can be prevented from being allergic to the metal contact component 1 when the user holds it, and the user's experience is improved. The bonding strength of the pore sealing layer 16 and the inner wall of the micropores 141 is higher than the bonding strength of the non-allergenic contact layer 12 and the inner wall of the micropores 141. Thus, compared with the solution adopting a nickel-free pore sealing process in the related art, protection for the coloring layer 15 can be enhanced, especially, color escaping can be reduced during pore sealing. The diameter of each of the micropores 141 may be larger than or equal to 10 nanometers, for example, the diameter of each of the micropores 141 may be larger than or equal to 80 nanometers, and subsequent deposition of the coloring layer 15 can be realized within this diameter range. The non-allergenic contact layer 12 means that the non-allergenic contact layer 12 is made of the material to which a human body is not allergic.

In some embodiments, the metal substrate includes an aluminum alloy substrate, an aluminum substrate, a magnesium alloy substrate or a titanium alloy substrate. The metal substrate 11 may be obtained through machining of raw materials. For example, the metal substrate 11 may be obtained after one or more processes among a CNC machining process, a polishing process, a sandblasting process and a wiredrawing process. Subsequently, the metal substrate 11 after machining may be cleaned with pure water, and then subsequent treatment is performed after drying. As for the blocking layer 13 and the porous layer 14, the metal substrate 11 may be subjected to an anodizing process so as to form the blocking layer 13 and the porous layer 14 simultaneously. The blocking layer 13 is arranged on the surface of the metal substrate 11, the blocking layer 13 is located between the metal substrate 11 and the porous layer 14. The compactness of the blocking layer 13 is larger than that of the porous layer 14, so that the coloring layer 15 can be blocked to a certain degree. The metal substrate 11 may be subjected to metal oxidization in an anodizing electrolyte, so that the blocking layer 13 and the porous layer 14 are formed on the surface of the metal substrate 11. The electrolyte in the anodizing process may include one or more solutions among oxalic acid, sulfuric acid, chromic acid and phosphoric acid. For example, the electrolyte may include sulfuric acid. The concentration of sulfuric acid in the electrolyte may be larger than or equal to 150 g/L but smaller than or equal to 220 g/L, the concentration of aluminum ions in the electrolyte may be larger than or equal to 5 mg/L but smaller than or equal to 15 mg/L. The oxidization voltage may be 12.5V, the temperature of the electrolyte may be larger than or equal to 10° C. but smaller than or equal to 14° C., and the oxidization duration is 30 minutes to 60 minutes. In some embodiment, the surface of the metal substrate 11 is treated through the anodizing process, so as to the blocking layer 13 and the porous layer 14 may be formed on the surface of the metal substrate 11, and the wear resistance and the hardness of the subsequent metal contact component 1 can be improved. Certainly, in some embodiments, the surface of the metal substrate 11 may be subjected to etching or other corrosion processes so as to form the porous layer 14, and the porous layer 14 may be directly formed on the surface of the metal substrate 11, which is not limited herein.

The first bath solution may include a nickel salt solution, for example, a nickel acetate solution. The metal substrate 11 with the coloring layer 15 formed after coloring is put in the first closed tank containing the nickel salt solution for first-stage pore sealing treatment, and the pore sealing layer 16 covering the coloring layer 15 may be deposited in the micropores 141 through the first-stage pore sealing treatment. The material of the pore sealing layer 16 is related to the first bath solution. When the first bath solution is the nickel salt solution, the material of the pore sealing layer 16 may be nickel or a nickel-based compound. When the first bath solution is other metal salt solutions, the material of the pore sealing layer 16 may be a corresponding metal, for example, a non-nickel-based compound. Especially, when the material of the pore sealing layer 16 is nickel or the nickel-based compound, by means of the high bonding strength of the pore sealing layer 16 and the inner wall of the micropores 141, the pore sealing layer 16 can be prevented from falling off, the protection for the coloring layer 15 is realized, and meanwhile, the corrosion resistance of the formed metal contact component 1 can be improved. Description is made here only by taking the nickel salt solution including nickel acetate for example. In some embodiments, the nickel salt solution may include nickel chromate and the like, which is not limited herein.

In the first-stage pore sealing treatment process, the PH value of the nickel salt solution may be larger than or equal to 5.5 but smaller than or equal to 6. The "powder frost" or corrosive pitting can be prevented from forming on the surface of the film layer after pore sealing is completed within this PH value range, the pore sealing quality is guaranteed advantageously, and the corrosion resistance and the wear resistance are good. The concentration of nickel salt in the nickel salt solution may be larger than or equal to 8 g/L but smaller than or equal to 15 g/L. For example, when the nickel salt solution includes the nickel acetate solution, the concentration of nickel salt, namely, the concentration of nickel acetate in the nickel solution is larger than or equal to 8 g/L but smaller than or equal to 15 g/L, so that the concentration of nickel ions in the nickel salt solution is guaranteed, and the pore sealing quality is guaranteed. Furthermore, the temperature of the first bath solution may be larger than or equal to 93° C. but smaller than or equal to 98° C. The pore sealing layer 16 formed at this temperature has high corrosion resistance. As for the first-stage pore sealing process, the shell to be subjected to pore sealing is put in the first bath solution to be soaked for a first duration. The first duration may be longer than or equal to 10 minutes, for instance, the first duration may be shorter than or equal to 30 minutes. The thickness of the formed pore sealing layer 16 may be adjusted by controlling the first duration, the thickness of the pore sealing layer 16 in the micropores 141 may be effectively controlled within this duration range, and thus a certain space may be reserved in the micropores 141 for subsequently depositing the non-allergenic contact layer 12. In some embodiments, the first duration may be longer than or equal to 15 minutes but shorter than or equal to 20 minutes, the pore sealing layer 16 with the thickness being larger than or equal to 6 micrometers may be formed, for instance, the thickness of the pore sealing layer 16 may be smaller than or equal to 8 micrometers. The thickness demand of a nickel compound layer with a certain corrosion resistance may be considered within this duration, and meanwhile, a space can be reserved for depositing the non-allergenic contact layer 12.

In the above embodiments, the second bath solution may include at least one of a cerium salt solution or a lithium salt solution. For example, the second bath solution may include a cerium sulfate tetrahydrate solution. The metal substrate 11 with the pore sealing layer 16 formed thereon may be put in the solution containing cerium sulfate tetrahydrate to be soaked for a second duration, so that the non-allergenic contact layer 12 is formed. The second duration may be longer than or equal to 8 minutes but shorter than or equal to 30 minutes. The concentration of the cerium sulfate tetrahydrate in the second bath solution is smaller than or equal to 2.5 g/L, the non-allergenic contact layer 12 covering the pore sealing layer 16 may be deposited in the micropores 141. The non-allergenic contact layer 12 may form the appearance surface of the metal contact component 1 to prevent the user from being allergic, and the user's experience is improved. Certainly, in some embodiments, description is made only by taking the second bath solution including at least one of the cerium salt solution or the lithium salt solution to form the non-allergenic contact layer 12 for example. In some embodiments, the second bath solution may include a compound solution of a salt of other non-allergenic materials, which is not limited herein.

The temperature of the second bath solution may be larger than or equal to 80° C. but smaller than or equal to 98° C., so that the non-allergenic contact layer 12 with good corrosion resistance can be formed at this temperature. In some embodiments, a soaking duration of the metal substrate 11 in the second bath solution may be longer than or equal to 8 minutes, for instance, the second duration may be shorter than or equal to 30 minutes. The thickness of the deposited non-allergenic contact layer 12 may be adjusted by adjusting the soaking duration so as to be kept in a reasonable thickness range. For example, the thickness of the non-allergenic contact layer 12 may be larger than or equal to 3 micrometers, further, the thickness of the non-allergenic contact layer 12 may be smaller than or equal to 4 micrometers, so as to avoid that the bonding strength between the non-allergenic contact layer 12 and the inner wall of the micropores 141 is too weak and the non-allergenic contact layer 12 falls off due to the non-allergenic contact layer 12 is too thin, and avoid that the non-allergenic contact layer 12 is protruded out of the micropores 141 and the appearance touch feeling is affected due to the non-allergenic contact layer 12 is too thick.

In some embodiment, in order to improve the corrosion resistance of the non-allergenic contact layer 12, the second bath solution may include cerium salt, ammonium persulfate and potassium permanganate. The ammonium persulfate and the potassium permanganate can promote the conversion from a trivalent cerium ion to a tetravalent cerium ion, thus a cerium compound with better corrosion resistance is deposited in the micropores 141. The cerium compound may include the combined layer of cerium hydroxide and cerium dioxide, to improve the corrosion resistance of the non-allergenic contact layer 12. The concentration of the ammonium persulfate in the second bath solution is smaller than or equal to 2.5 g/L, the concentration of the potassium permanganate in the second bath solution may be larger than or equal to 0.2 g/L but smaller than or equal to 5 g/L. The thickness of the deposited cerium compound layer may be adjusted to make it within a reasonable range by controlling the concentration of the ammonium persulfate and the potassium permanganate, and the cerium compound layer is the non-allergenic contact layer 12. In some embodiments, the non-allergenic contact layer 12 may include a cerium hydroxide layer or a cerium dioxide layer.

Description is made here only by taking the second bath solution including cerium salt, ammonium persulfate and potassium permanganate for example. In some embodiments, the second bath solution may include cerium salt and ammonium persulfate, or cerium salt and potassium permanganate, which is not limited herein. In some embodiments, the second bath solution may be a mixed solution of a compound of a metal salt of other non-allergenic materials and at least one of the ammonium persulfate or the potassium permanganate. The above description is made by taking the non-allergenic contact layer 12 including the cerium compound layer for example. In some embodiments, by adjusting the second bath solution, the non-allergenic contact layer 12 may include a lithium compound or a sodium compound, or the non-allergenic contact layer 12 may include a plurality of types among cerium compound, lithium compound and sodium compound, which is not limited herein.

In the above embodiments, in order to realize colored display of the metal contact component 1, the coloring layer 15 may be formed in the micropores 141 and may be deposited in each of the micropores 141. For example, metal or metal oxide particles can be deposited at the bottom of the micropores 141 through an electrolytic coloring process, the metal contact component 1 may display different colors due to scattering effect of light. The quantity of deposited particles may be adjusted by adjusting coloring duration and externally applied voltage of the electrolytic coloring process, and thus the purpose of adjusting color shade can be realized. In some embodiments, coloring of the porous layer 14 may be performed through a dyeing process, specifically, the metal substrate 11 with the porous layer 14 formed thereon may be put in the solution containing dyestuff, and the micropores 141 can adsorb the dyestuff so as to form the coloring layer 15.

Figure 4:
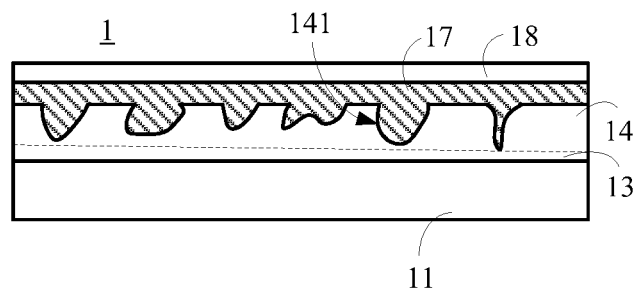
FIG. 4 is a schematic sectional view of yet another metal contact component shown according to an embodiment.

The disclosure further provides a metal contact component 1 shown in FIG. 4 for improving the appearance attractiveness of the wristband 100. As shown in FIG. 4, the non-allergenic contact layer 12 may include a non-allergenic color decorative layer 18. The metal contact component 1 may include a metal substrate 11, a blocking layer 13, a porous layer 14, an attachment layer 17 and the non-allergenic color decorative layer 18. The blocking layer 13 is arranged on the surface of the metal substrate 11, the porous layer 14 is arranged on the surface of the blocking layer 13, the attachment layer 17 may be arranged on the surface of the porous layer 14 facing away from the metal substrate 11 and can fill in the micropores 14 included in the porous layer 14, and the non-allergenic color decorative layer 18 may be arranged on the surface of the attachment layer 17 and is located on the side of the attachment layer 17 away from the porous layer 14. Based on this, in the disclosure, the porous layer 14 may be formed on the surface of the metal substrate 11 first, and then the attachment layer 17 is formed on the surface of the porous layer 14. The attachment strength of the non-allergenic color decorative layer 18 can be improved through the attachment layer 17 so as to prevent the non-allergenic color decorative layer 18 from falling off, a color decorative effect can be realized through the non-allergenic color decorative layer 18, and the user's experience is improved. The opening direction of the micropores 141 of the porous layer 14 faces the side facing away from the metal substrate 11.

In some embodiments, the metal substrate 11 includes an aluminum alloy substrate, an aluminum substrate, a magnesium alloy substrate or a titanium alloy substrate. The metal substrate 11 may be obtained through machining of raw materials, for example, the metal substrate 11 may be obtained after one or more processes among CNC machining process, polishing process, sand blasting process and wiredrawing process. Subsequently, the metal substrate 11 after machining can be cleaned with pure water, and subsequent treatment is performed after drying. As for the blocking layer 13 and the porous layer 14, the metal substrate 11 may be subjected to an anodizing process so as to form the blocking layer 13 and the porous layer 14 simultaneously. The blocking layer 13 is arranged on the surface of the metal substrate 11 and located between the metal substrate 11 and the porous layer 14. The compactness of the blocking layer 13 is larger than that of the porous layer 14, and thus the attachment layer 17 can be blocked to a certain degree. The metal substrate 11 may be subjected to metal oxidization in an anodizing electrolyte, and thus the blocking layer 13 and the porous layer 14 are formed on the surface of the metal substrate 11. The electrolyte in the anodizing process may include one or more solutions among oxalic acid, sulfuric acid, chromic acid and phosphoric acid. For example, the electrolyte may include sulfuric acid, the concentration of the sulfuric acid in the electrolyte may be larger than or equal to 150 g/L but smaller than or equal to 220 g/L, the concentration of aluminum ions in the electrolyte may be larger than or equal to 5 mg/L but smaller than or equal to 15 mg/L, the oxidization voltage may be 12.5V, the temperature of the electrolyte may be larger than or equal to 10° C. but smaller than or equal to 14° C., and the oxidization duration is 30 to 60 minutes. In some embodiments, the surface of the metal substrate 11 is treated through the anodizing process, the blocking layer 13 and the porous layer 14 on the surface of the metal substrate 11 may be formed, and the wear resistance and the hardness of the subsequent metal contact component 1 can be improved. Certainly, in some embodiments, the surface of the metal substrate 11 may be subjected to etching or other corrosion processes so as to form the porous layer 14, and the porous layer 14 may be directly formed on the surface of the metal substrate 11, which is not limited herein. The diameter of the micropore 141 included in the porous layer 14 may be larger than or equal to 10 nanometers, for example, the diameter of the micropore 141 may be smaller than or equal to 80 nanometers, and subsequent deposition of the attachment layer 17 is better realized within this diameter range.

As for the attachment layer 17, in some embodiments, a nitriding precursor may be deposited on the surface of the porous layer 14. The nitriding precursor can fill in the micropores 141 of the porous layer 14, and then the nitriding precursor is subjected to nitriding treatment or carbonitriding treatment so as to obtain the attachment layer 17. The attachment layer 17 may include a metal nitride layer or a metal carbonitride layer, The good wear resistance and corrosion resistance of metal nitride and metal carbonitride can improve the corrosion resistance of the attachment layer 17 and the wear resistance and the corrosion resistance of the metal contact component 1. The nitriding treatment or the carbonitriding treatment may be performed in the temperature environment of 380° C. to 460° C. so as to obtain the attachment layer 17 with good compactness. The thickness of the attachment layer 17 is larger than or equal to 1 nanometer but smaller than or equal to 200 nanometers, so as to avoid attachment force is poor due to the attachment layer 17 is too thin, and the whole thickness of the metal contact component 1 is increased due to the attachment layer 17 is too thick.

The nitriding precursor may be formed on the surface of the porous layer 14 through vacuum coating method, synchronously, the nitriding precursor may be deposited through plasma assisted deposition method, thus a compact and continuous nitriding precursor may be obtained on the surface of the porous layer 14, and the strength and the compactness of the subsequently formed attachment layer 17 can be improved. In order to improve the nitriding efficiency and the bonding capability of the attachment layer 17, during the process of the vacuum coating method, nitrogen may be filled into a vacuum chamber, the nitrogen flow may be larger than or equal to 10 standard milliliters per minute but smaller than or equal to 30 standard milliliters per minute. The filled nitrogen is combined with metal ions sputtered from a metal target material, thus a layer of metal oxide thin film may be formed on the surface of the porous layer 14, and the nitriding treatment can be performed on the metal oxide thin film subsequently. Compared with the conventional process of direct nitriding treatment for a metal material in the related art, the bonding strength of the film-base of the attachment layer 17 formed in the disclosure is higher, the compactness of the thin film is higher, the bonding strength of the attachment layer 17 to the porous layer 14 and the non-allergenic color decorative layer 18 can be improved, and meanwhile, the wear resistance and the corrosion resistance of the metal contact component 1 can be improved. In some embodiments, description is made by taking a layer of metal nitride thin film formed on the surface of the porous layer 14 for example. In some embodiments, a bonding layer of metal nitride and elemental metal or a layer of elemental metal may be formed on the surface of the porous layer 14, which is not limited in the disclosure.

Adopted metal target materials are different in the vacuum coating process, and thus formed nitriding precursors are different in material. For example, the metal target materials may include chromium metal, nitrogen is filled while the chromium metal is bombarded in the vacuum chamber, a chromium nitride coating may be formed on the surface of the porous layer 14. The chromium nitride coating may be deposited through the plasma assisted deposition method, the compactness of the chromium nitride coating is improved. And after subsequent nitriding treatment or carbonitriding treatment for the chromium nitride coating, a chromium nitride layer or a chromium carbonitride layer may be formed to serve as the attachment layer 17. Description is made herein by taking the nitriding precursor including the chromium nitride coating for example. In some embodiments, the nitriding precursor may include a chromium coating, or a chromium and chromium nitride bonding coating, which is not limited herein. The chromium metal is adopted as the metal target material, and the high hardness of chromium metal may be utilized, so that the hardness of the attachment layer 17 formed through the nitriding treatment or the carbonitriding treatment are improved. During the vacuum coating process in the vacuum chamber, the power for bombarding the metal target material may be larger than or equal to 45 KW but smaller than or equal to 2000 KW, for example, the power of bombarding the metal target material may be larger than or equal to 60 KW but smaller than or equal to 80 KW.

In the above embodiments, in order to improve the compactness of the attachment layer 17, the nitriding precursor is deposited synchronously through the plasma assisted deposition method while it is subjected to vacuum coating. Argon may be filled during the process of the plasma assisted deposition method, the argon flow is larger than or equal to 10 standard milliliters per minute but smaller than or equal to 100 standard milliliters per minute. A good deposition effect of the argon can be realized within this range. A base pressure in the treatment process of the plasma assisted deposition method is larger than or equal to 0.001 Pa and smaller than or equal to 0.1 Pa.

As for the non-allergenic color decorative layer 18 of the metal contact component 1, the non-allergenic color decorative layer 18 may be made of non-allergenic material so as to prevent the user from being allergic. Specifically, the non-allergenic color decorative layer 18 may be formed on the surface of the attachment layer 17 through a physical vapor deposition method. The non-allergenic color decorative layer 18 may adopt different metal elements according to color demands of the metal contact component 1. For example, when the metal contact component 1 needs to display a golden color, a titanium compound layer may be deposited on the attachment layer 17 by bombarding a titanium target. For another example, when the metal contact component 1 needs to display a blue color, a tungsten compound layer may be deposited on the attachment layer 17 by bombarding a tungsten target. For another example, when the metal contact component 1 needs to display a black color, a chromium compound layer may be deposited on the attachment layer 17 by bombarding a chromium target. In some embodiments, the non-allergenic color decorative layer 18 may include the tungsten compound layer or the titanium compound layer or the chromium compound layer. In some embodiments, the non-allergenic color decorative layer 18 may include a plurality of layers among a titanium layer, the titanium compound layer, a tungsten layer, the tungsten compound layer, a chromium layer or the chromium compound layer, which is not limited herein.

Certainly, apart from the above embodiments, in some cases, the non-allergenic contact layer 12 may be directly formed on the surface of the metal substrate 11, or arranged on the metal substrate 11 through other layer structures for improving the attachment force, which is not limited herein.

Figure 5:
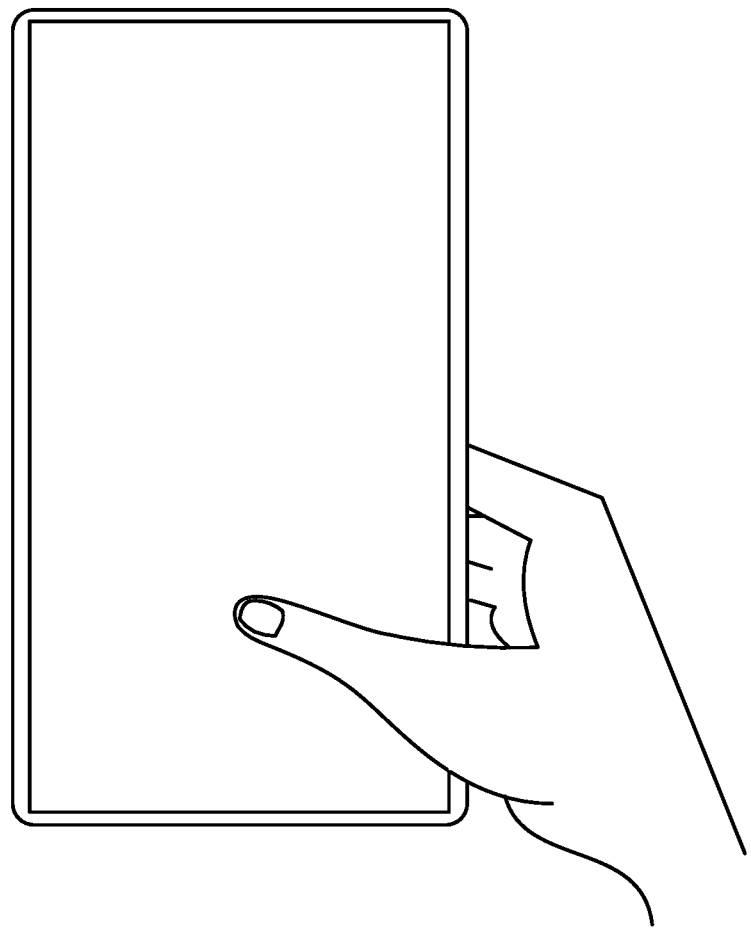
FIG. 5 is a schematic structural diagram of another terminal device shown according to an embodiment.

In the above embodiments, description is made by taking the terminal device being the wristband for example. Actually, in some embodiments, the terminal device may include other wearable devices besides the wristband. For example, the wearable devices may include a watch, a shoulder and neck massager, smart headphones, etc. Certainly, besides the wearable devices, the terminal device may include a mobile network communication terminal shown in FIG. 5. The mobile network communication terminal may include a mobile phone terminal, a tablet terminal, an e-reader, etc. and is not limited herein.

Those skilled in the art will easily figure out other implementation solutions of the disclosure after considering the specification and practising the disclosure disclosed herein. The disclosure intends to cover any modification, application or adaptive change of the disclosure, which conform to a general principle of the disclosure and include common general knowledge or conventional technical means not disclosed herein in the technical field.

It should be understood that the disclosure is not limited to the above accurate structure described above and shown in the drawings and allow various modifications and changes without departing from its scope. The scope of the disclosure is limited by the appended claims.

The invention claimed is:

1. A terminal device comprising a metal contact component, wherein the metal contact component comprises:
   a metal substrate;
   a non-allergenic contact layer, on the metal substrate, wherein the non-allergenic contact layer forms a part of an outer surface of the terminal device; and
   a porous layer, on one or more sides of the metal substrate and comprising a plurality of micropores.

2. The terminal device of claim 1, wherein the metal contact component further comprises:
   a coloring layer, in each of the plurality of micropores; and a pore sealing layer, in each of the plurality of micropores and covering the coloring layer, wherein the non-allergenic contact layer is in each of the plurality of micropores and covers the pore sealing layer.

3. The terminal device of claim 2, wherein a bonding strength of the pore sealing layer and an inner wall of the plurality of micropores is higher than a bonding strength of the non-allergenic contact layer and the inner wall of the plurality of micropores.

4. The terminal device of claim 2, wherein a material of the pore sealing layer is at least one of the following: nickel, a nickel-based compound and a non-nickel-based compound.

5. The terminal device of claim 2, wherein a thickness of the pore sealing layer is larger than or equal to 6 micrometers.

6. The terminal device of claim 2, wherein the pore sealing layer comprises a nickel hydroxide layer.

7. The terminal device of claim 2, wherein a thickness of the non-allergenic contact layer is larger than or equal to 3 micrometers.

8. The terminal device of claim 1, wherein the non-allergenic contact layer comprises at least one of the following:
a cerium compound, a lithium compound or a sodium compound.

9. The terminal device of claim 1, wherein the metal contact component further comprises:
an attachment layer, on a surface of the porous layer facing away from the metal substrate and filling each of the plurality of micropores, wherein the non-allergenic contact layer comprises a non-allergenic color decorative layer formed on a surface of the attachment layer facing away from the porous layer.

10. The terminal device of claim 9, wherein the attachment layer comprises a metal nitride layer.

11. The terminal device of claim 9, wherein the attachment layer comprises a chromium nitride layer or a chromium carbonitride layer.

12. The terminal device of claim 9, wherein the non-allergenic color decorative layer comprises at least one of the following:
a titanium layer, a titanium compound layer, a tungsten layer, a tungsten compound layer, a chromium layer and a chromium compound layer.

13. The terminal device of claim 9, wherein a thickness of the attachment layer is larger than or equal to 1 nanometer but smaller than or equal to 200 nanometers.

14. The terminal device of claim 2, wherein a diameter of each of the plurality of micropores is larger than or equal to 10 nanometers.

15. The terminal device of claim 2, wherein the metal contact component further comprises:
a blocking layer, on a surface of the metal substrate, wherein the porous layer is on a surface of the blocking layer facing away from the metal substrate, and wherein
a compactness of the blocking layer is larger than a compactness of the porous layer.

16. The terminal device of claim 9, wherein the metal contact component further comprises:
a blocking layer, on the surface of the metal substrate, wherein the porous layer is on a surface of the blocking layer facing away from the metal substrate, and wherein a compactness of the blocking layer is larger than a compactness of the porous layer.

17. The terminal device of claim 1, wherein the metal substrate comprises an aluminum alloy substrate, an aluminum substrate, a magnesium alloy substrate or a titanium alloy substrate.

18. The terminal device of claim 1, wherein the terminal device is a watch or a wristband, and one or more members among a shell, a frame, a buckle, a magnetic interface and a watchband of the terminal device comprise the metal contact component.

19. The terminal device of claim 1, wherein the terminal device comprises a mobile phone, a watch or a wristband.

* * * * *